United States Patent
Iacopi et al.

(10) Patent No.: US 11,348,824 B2
(45) Date of Patent: May 31, 2022

(54) ELECTRICAL ISOLATION STRUCTURE AND PROCESS

(71) Applicant: University of Technology Sydney, Ultimo (AU)

(72) Inventors: Francesca Iacopi, Ultimo (AU); Aiswarya Pradeepkumar, Ultimo (AU)

(73) Assignee: UNIVERSITY OF TECHNOLOGY SYDNEY, Ultimo (AU)

( * ) Notice: Subject to any disclaimer, the term of this patent is extended or adjusted under 35 U.S.C. 154(b) by 14 days.

(21) Appl. No.: 16/646,945

(22) PCT Filed: Sep. 13, 2018

(86) PCT No.: PCT/AU2018/050999
§ 371 (c)(1),
(2) Date: Mar. 12, 2020

(87) PCT Pub. No.: WO2019/051550
PCT Pub. Date: Mar. 21, 2019

(65) Prior Publication Data
US 2020/0266094 A1    Aug. 20, 2020

(30) Foreign Application Priority Data

Sep. 13, 2017 (AU) ............... 2017903720
Dec. 1, 2017 (AU) ............... 2017904860

(51) Int. Cl.
*H01L 21/76* (2006.01)
*H01L 21/02* (2006.01)
(Continued)

(52) U.S. Cl.
CPC .... *H01L 21/7602* (2013.01); *H01L 21/02167* (2013.01); *H01L 21/02529* (2013.01); *H01L 21/2022* (2013.01); *H01L 21/3213* (2013.01)

(58) Field of Classification Search
None
See application file for complete search history.

(56) References Cited

U.S. PATENT DOCUMENTS 5,326,991 A    7/1994  Takasu
2009/0181502 A1*  7/2009  Parikh ............... H01L 29/66742
                                                    438/164
(Continued)

FOREIGN PATENT DOCUMENTS

EP    0 363 944    4/1990
JP    H05 175326 A   7/1993
(Continued)

OTHER PUBLICATIONS

International Search Report, PCT/AU2018/050999, dated Nov. 5, 2018.
(Continued)

*Primary Examiner* — Alexander G Ghyka
(74) *Attorney, Agent, or Firm* — Knobbe, Martens, Olson & Bear, LLP (57) ABSTRACT

An electrical isolation process, includes receiving a substrate including a layer of carbon-rich material on silicon, and selectively removing regions of the substrate to form mutually spaced islands of the carbon-rich material on the silicon. The layer of carbon-rich material on silicon includes the layer of carbon-rich material on an electrically conductive layer of silicon on an electrically insulating material. Selectively removing regions of the substrate includes removing the carbon-rich material and at least a portion of the electrically conductive layer of silicon from those regions to provide electrical isolation between the islands of carbon-rich material on silicon.

23 Claims, 5 Drawing Sheets

(51) Int. Cl.
*H01L 21/20* (2006.01)
*H01L 21/3213* (2006.01)

(56) References Cited

U.S. PATENT DOCUMENTS

| | | | | |
|---|---|---|---|---|
| 2010/0270561 A1* | 10/2010 | Ogihara | ............. | H01L 21/7602 |
| | | | | 257/77 |
| 2011/0024767 A1* | 2/2011 | Sung | .................... | H01L 21/568 |
| | | | | 257/77 |

FOREIGN PATENT DOCUMENTS

| | | | |
|---|---|---|---|
| JP | H06208949 A | 7/1994 | |
| JP | H0769793 A | 3/1995 | |

OTHER PUBLICATIONS

Extended European Search Report in EP18857119.4 dated May 10, 2021.

Cunning, Benjamin V., et al., "Graphitized silicon carbide microbeams: wafer-level, self-aligned graphene on silicon wafers", Nanotechnology, vol. 25, No. 32, Jul. 23, 2014, p. 325301 (7 pages).

\* cited by examiner

ELECTRICAL ISOLATION STRUCTURE AND PROCESS

TECHNICAL FIELD

The present invention relates to an electrical isolation structure and process, which may include (or may be used to form) mutually spaced and mutually electrically isolated islands of a carbon-rich material such as silicon carbide, diamond or diamond-like carbon on a layer of silicon on an electrical insulator.

BACKGROUND

Both Silicon Carbide (SiC) and Silicon (Si) are semiconducting materials that are used to create products such as memory, light emitting diodes (LEDs), micro-electro-mechanical systems (MEMS) and other types of devices. For example, crystalline SiC is the material of choice for MEMS transducers when device reliability in extreme environments is a primary concern. However, due to both the high cost of bulk SiC wafers and their expensive bulk micromachining processes, the use of SiC has been limited to only a few applications, typically those found in the aerospace industry.

However, recent improvements in SiC growth reactor technology has enabled the formation of thin, high quality epitaxial layers of SiC on Si wafers up to 300 mm in diameter at a reasonable cost. Thin film hetero-epitaxial SiC on Si has vast potential for MEMS, as it enables the realization of advanced micro-transducers that benefit from the mechanical properties of the SiC on low-cost Si substrates through established fabrication processes (including silicon micromachining). Similarly, the relatively large bandgap of SiC makes it well suited for power electronics and harsh environments. In addition, Si wafers with diameters up to 300 mm are now readily available, contributing to the overall reduction of SiC device production costs.

In addition to the above, the relatively new material graphene, consisting of a two-dimensional sheet of carbon, is currently an extremely active area of research due to graphene's many desirable properties (including extremely high fracture strength and electrical and thermal conductivities, lubrication properties, optical thinness (making the graphene appropriate for electronic screens), and excellent functionality (for sensors). Recently, a new process was developed to allow thin films of graphene to be formed via forming alloys from metals deposited on SiC.

Despite the enormous potential of the above and other related technologies based on thin films of heteroepitaxial SiC on Si, a 'showstopper' to the development of devices and structures based on this material is that the electrical properties of hetero-epitaxial SiC on Si are severely compromised by substantial leakage current or even complete electrical shorting of the SiC layer to the underlying silicon. This problem is recognised by the SiC community as a universal limitation of the SiC on silicon system, and is believed to be caused by the presence of stacking faults in the SiC originating at the SiC/silicon interface, as described in X. Song et. al, Applied Physics Letters 96, 142104 2010, which relieve strain in the SiC arising from the lattice mismatch between the SiC and the underlying Si. For example, in the case of 3C—SiC on Si, the strain is of the order of 20%. Attempts to overcome this fundamental limitation include growing SiC on a AlN layer rather than directly on silicon, as described in S. Jiao et. al., *Materials Science Forum* 806, 89 (2014).

It is desired to provide an electrical isolation structure and process that alleviate one or more difficulties of the prior art, or that at least provide a useful alternative.

SUMMARY

In accordance with some embodiments of the present invention, there is provided an electrical isolation process, including:
  receiving a substrate including a layer of carbon-rich material on silicon; and
  selectively removing regions of the substrate to form mutually spaced islands of the carbon-rich material on the silicon;
  wherein the layer of carbon-rich material on silicon includes the layer of carbon-rich material on an electrically conductive layer of silicon on an electrically insulating material, and the step of selectively removing regions of the substrate includes removing the carbon-rich material and at least a portion of the electrically conductive layer of silicon from those regions to provide electrical isolation between the islands of carbon-rich material on silicon.

In some embodiments, the electrically insulating material is silicon.

In some embodiments, the electrical isolation process includes forming the substrate by growing the carbon-rich material on an electrically insulating silicon substrate, wherein the step of growing includes forming the electrically conductive layer of silicon between the layer of carbon-rich material and a remaining portion of the electrically insulating silicon substrate.

In some embodiments, the step of removing the carbon-rich material and at least a portion of the silicon includes removing only a portion of the electrically conductive layer of silicon.

In some embodiments, the step of removing the carbon-rich material and at least a portion of the silicon includes removing the electrically conductive layer of silicon.

In some embodiments, the carbon-rich material is 3C—SiC epitaxial with the silicon substrate, and the step of selectively removing regions of the substrate includes removing at least about 20 microns of the silicon substrate.

In some embodiments, the substrate includes the layer of carbon-rich material on a silicon-on-insulator (SOI) substrate.

In some embodiments, the electrically insulating material is sapphire or a layer of electrically insulating silicon on sapphire.

In some embodiments, the electrically insulating material is a silicon oxide material or a layer of electrically insulating silicon on a silicon oxide material.

In some embodiments, the electrical isolation process includes forming the substrate by growing the carbon-rich material on the silicon-on-insulator (SOI) substrate.

In some embodiments, the step of selectively removing regions of the substrate includes removing all of a silicon layer of the SOI substrate from those regions.

In some embodiments, the electrical isolation process includes estimating a thickness of the removed silicon based on a corresponding diffusion length of interstitial carbon in silicon.

In some embodiments, the electrical isolation process includes estimating a thickness of the removed silicon based on electrical measurements of corresponding substrates etched to different depths.

In some embodiments, the carbon-rich material is diamond or diamond-like carbon.

In some embodiments, the carbon-rich material is silicon carbide.

In accordance with some embodiments of the present invention, there is provided an electrical isolation structure formed by any one of the above processes.

In accordance with some embodiments of the present invention, there is provided an electrical isolation structure, including:
  a substrate composed of an electrically insulating substance; and
  mutually spaced islands of a carbon-rich material on silicon (Si) on the electrically insulating substance such that the mutually spaced islands of carbon-rich material are mutually electrically isolated;
  wherein the silicon of the carbon-rich material on silicon islands is or includes an electrically conductive layer of silicon in contact with the carbon-rich material, such that, if the electrically conductive layer of silicon extended between the mutually spaced islands to interconnect the mutually spaced islands, the mutually spaced islands would not be mutually electrically isolated.

In accordance with some embodiments of the present invention, there is provided an electrical isolation structure, including:
  a substrate composed of an electrically isolating substance; and
  mutually spaced islands of carbon-rich material on silicon on the electrically isolating substance;
  wherein at least a portion of the silicon has been removed from regions between the mutually spaced islands of carbon-rich material so as to provide electrical isolation therebetween.

In some embodiments, the electrically insulating material is silicon.

In some embodiments, the carbon-rich material on silicon islands extend to a thickness of at least 1 micron above the electrically insulating silicon located between the mutually spaced islands of carbon-rich material on silicon.

In some embodiments, the carbon-rich material on silicon islands extend to a distance above the electrically insulating silicon located between the mutually spaced islands of carbon-rich material on silicon, wherein the distance is greater than or equal to a diffusion length of interstitial carbon in silicon during growth of the carbon-rich material on the Si.

In some embodiments, the electrically insulating material is sapphire or a silicon oxide material.

In some embodiments, the carbon-rich material is diamond or diamond-like carbon.

In some embodiments, the carbon-rich material is silicon carbide.

In some embodiments, the carbon-rich material is 3C—SiC, and the SiC on Si islands extend to a thickness of at least about 20 microns above the electrically insulating silicon located between the mutually spaced islands of silicon carbide on silicon.

Also described herein is a SiC isolation process, including:
  receiving a substrate including a layer of silicon carbide on silicon; and
  selectively removing regions of the substrate to form mutually spaced islands of the silicon carbide on the silicon;
  wherein the step of selectively removing regions of the substrate includes removing the silicon carbide and at least a portion of the silicon from those regions to provide electrical isolation between the islands of silicon carbide on silicon.

Also described herein is a SiC isolation process, including:
  receiving a substrate including a layer of silicon carbide on silicon; and
  selectively removing regions of the substrate to form mutually spaced islands of the silicon carbide on the silicon;
  wherein the received substrate includes a defective layer on an electrically insulating material, the defective layer causing substantial electrical leakage to the silicon carbide, and the step of selectively removing regions of the substrate includes removing the silicon carbide and the defective layer from those regions to provide electrical isolation between the islands of silicon carbide on silicon.

Also described herein is a SiC isolation structure, including:
  a substrate composed of an electrically isolating substance; and
  mutually spaced islands of silicon carbide (SiC) on silicon (Si) on the electrically isolating substance such that the mutually spaced islands of silicon carbide are mutually electrically isolated;
  wherein the silicon of the silicon carbide on silicon islands includes (or is in the form of) a defective silicon layer of relatively low electrical resistivity in contact with the silicon carbide, such that, if the defective silicon layer extended between the mutually spaced islands to interconnect the mutually spaced islands, the mutually spaced islands would not be mutually electrically isolated.

Also described herein is a SiC isolation structure, including:
  a substrate composed of an electrically isolating substance; and
  mutually spaced islands of silicon carbide on silicon on the electrically isolating substance;
  wherein at least a portion of the silicon has been removed from regions between the mutually spaced islands of silicon carbide so as to provide electrical isolation therebetween.

Also described herein is a SiC isolation structure, including:
  a substrate composed of an electrically isolating substance; and
  mutually spaced islands of silicon carbide on silicon on the electrically isolating substance;
  wherein the mutually spaced islands include a defective layer under the silicon carbide, the defective layer being electrically conducting and in electrical contact with the silicon carbide, the defective layer being absent between the mutually spaced islands of silicon carbide so as to provide electrical isolation therebetween.

The thickness of the removed silicon may be in the range of about 1 to 20 microns, or at least about 1 micron, or about 2 microns, or about 5 microns, or about 10 microns, or about 15 microns, or about 20 microns.

BRIEF DESCRIPTION OF THE DRAWINGS

Some embodiments of the present invention are hereinafter described, by way of example only, with reference to the accompanying drawings, wherein.

DETAILED DESCRIPTION

As described above, silicon carbide (SiC) on silicon (Si) suffers from severe electrical leakage or even complete electrical shorting of the SiC to the Si, and it is currently believed by the SiC community that this is due to the presence of stacking faults in the SiC. Surprisingly, the inventors have determined: (i) that this severe electrical leakage also exists between spaced regions or 'islands' of SiC grown on an electrically insulating (e.g., high resistivity) Si layer or substrate, and (ii) that this electrical leakage can be at least reduced and even completely removed in substance by removing at least a surface layer of the silicon between the regions of SiC. Without wanting to be bound by theory, the inventors believe that, contrary to the teachings of the prior art, the leakage is almost entirely due to the presence of electrically active point defects, predominantly interstitial carbon, in the top portion of the silicon substrate layer.

In view of the above, the inventors have developed an electrical isolation structure and process that solve this fundamental problem for the first time, clearing the way for the development of relatively low cost devices formed from silicon carbide on silicon. Moreover, although some embodiments of the present invention are described below in the context of silicon carbide thin films, more generally the process and structure are equally applicable to other carbon-rich materials on silicon, in particular diamond and diamond-like carbon (DLC).

Figure 1:
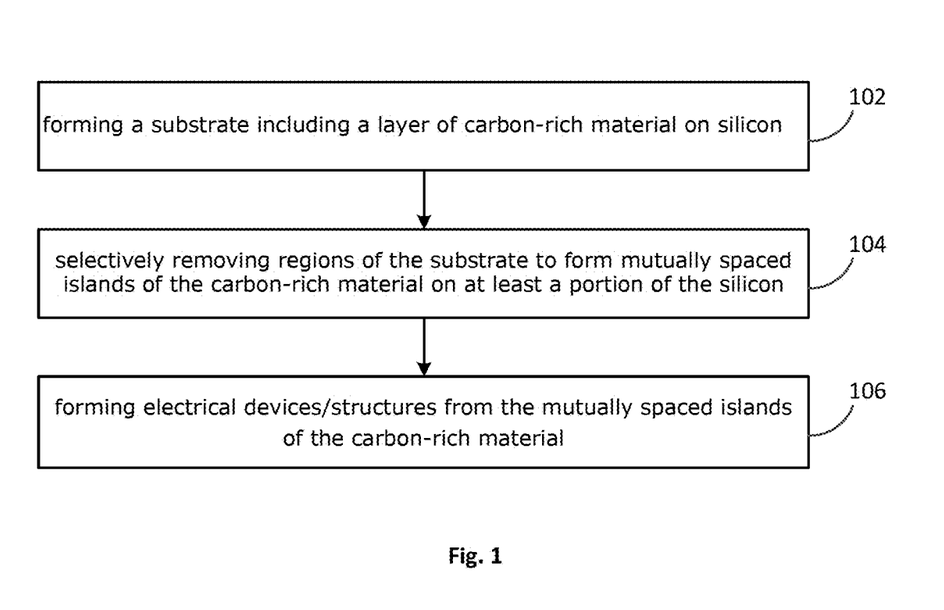
FIG. 1 is a flow diagram of a silicon carbide isolation process in accordance with an embodiment of the present invention.

As shown in FIG. 1, an electrical isolation process begins at step 102 with an initial substrate, which in the described embodiment is an electrically insulating (e.g., undoped or not intentionally doped) single-crystal silicon substrate or wafer, but in other embodiments may be a silicon-on-insulator (SOI) substrate. Typically, a silicon-on-insulator substrate consists of a relatively thin layer of single-crystal silicon on a layer or slab of an electrically insulating material, typically (but not necessarily) a silicon oxide compound (i.e., $SiO_2$ or more generally $SiO_x$) or sapphire (in which case the substrate is also referred to in the art as a silicon-on-sapphire or 'SOS' substrate). In the case of the insulator being a silicon oxide compound, the silicon oxide may also be in the form of an oxide layer on a much thicker substrate (which may be conductive silicon, for example).

Regardless of the specific form of SOI substrate used, a surface layer of silicon carbide is then epitaxially grown on the exposed single-crystal silicon layer using a standard epitaxial growth process known to those skilled in the art.

For example, in one embodiment, epitaxial cubic silicon carbide of 550 nm thickness was grown on 235 μm intrinsic silicon substrates at 1350° C., as described in M. Portail, M. Zielinski, T. Chassagne, S. Roy, and M. Nemoz, J. Appl. Phys. 105(8), 083505 (2009).

As an alternative to the above steps, the process may involve simply receiving a commercially available or otherwise existing hetero-epitaxial silicon-carbide-on-silicon substrate or wafer.

As already described above, the hetero-epitaxial silicon carbide on silicon system suffers from the absence of electrical isolation between the silicon carbide layer and the underlying silicon. To demonstrate this problem, both the locally made epitaxial cubic silicon carbide on intrinsic silicon wafers and commercially available silicon carbide on conductive silicon wafers were diced into 1.1×1.1 cm² samples, and electrical contacts were formed on the four corners of these samples by sputtering nickel to a thickness of 150 nm. The commercial wafers were obtained from the French company NOVASiC SA, and consisted of an unintentionally doped (thus n-type) 500 nm thick 3C—SiC(100) layer or film epitaxially grown at 1350° C. on 527p lowly doped electrically conductive p-type Si(100).

Figure 2:
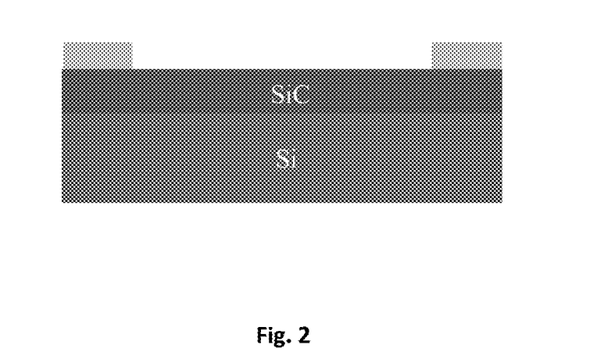
FIG. 2 is a schematic side view of a silicon carbide layer on a conductive (doped) silicon substrate with electrical contacts formed thereon.

The electrical properties of these samples, including carrier concentration, carrier mobility, and sheet resistance were estimated at room temperature by performing Hall measurements in a Van der Pauw configuration on the SiC(100) films, as shown in the schematic side-view of FIG. 2, and the same measurements were also performed on the lowly doped conductive substrates. The measurements were performed by directly connecting electrical probes to the metal contacts and sweeping the DC input current using an Ecopia HMS 5300 Hall Effect Measurement System. For comparison, Hall measurements were also carried out on unintentionally doped very thick (5 μm) 3C—SiC(100)

samples epitaxially grown at 1350° C.-1380° C. on p-Si as described in Bosi, M., Attolini, G., Negri, M., Frigeri, C., Buffagni, E., Ferrari, C., Rimoldi, T., Cristofolini, L., Aversa, L., Tatti, R., Verucchi, R. (2013), Journal of Crystal Growth, 383, 84-94.

Figure 3:
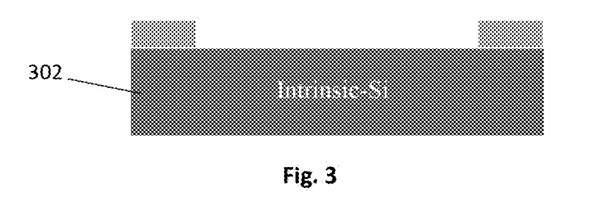
FIG. 3 is a schematic side view of an intrinsic (undoped) silicon substrate with electrical contacts formed thereon.

Complementary Hall measurements were also carried out at room temperature on 1.1×1.1 cm² fragments of the SiC/intrinsic silicon, as well as on the intrinsic substrates 302 (the latter shown in the schematic side-view of FIG. 3).

Table 1 below shows results of the Hall measurements in a Van der Pauw configuration over 1×1 cm² areas of the lowly doped p-Si(100) substrate and the 3C—SiC/p-Si at room temperature, demonstrating severe shorting of the silicon carbide film to the silicon substrate.

|  | p-Si | 3C—SiC/p-Si |
|---|---|---|
| Carrier type | Holes | Holes |
| Sheet carrier concentration (cm⁻²) | $1(\pm 0.2) \times 10^{14}$ | $1(\pm 0.2) \times 10^{14}$ |
| Mobility (cm²/Vs) | 341(±10) | 357(±10) |
| Sheet resistance (Ω/□) | 173 ± 10 | 166 ± 10 |

Figure 4:
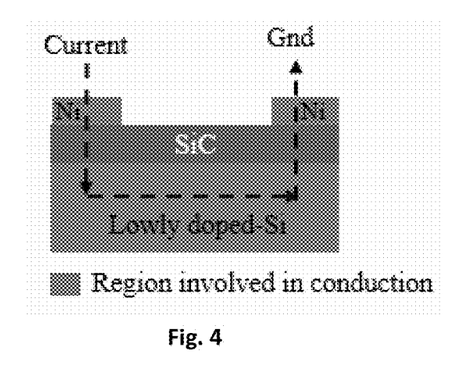
FIG. 4 is a schematic side view illustrating the electrical leakage flow through a conductive silicon substrate and between electrical contacts on a silicon carbide layer formed on the conductive silicon substrate.

The inventors have found that the electrical characteristics of the SiC film on a conductive p-type silicon substrate (either upon growth or during subsequent annealing) are surprisingly dominated by charge carriers in the thick silicon substrate, with relatively high mobility, as shown in FIG. 4.

As described above, the electrical activity of extended defects such as stacking faults in the epitaxially grown SiC is described in the literature to explain the leakage in 3C—SiC devices. However, the inventors believe that stacking faults are not the primary cause of the leakage, at least because the effect is still apparent for silicon carbide films up to 5 μm thick (where the density of stacking faults decreases by orders of magnitude), as shown in Table 2 below. Rather, the inventors primarily attribute the shorting phenomenon to the presence of interstitial carbon in a layer of the silicon at the SiC/Si interface. Interstitial carbon is a hole trap in silicon, and can also act as an n-type dopant (with respective band gap levels at Ev+0.35 eV and Ec-0.25 eV).

The presence of a relatively high content of interstitial C in the top portion of the silicon substrate is also consistent with the observation that the silicon substrate adopts a more convex curvature after SiC growth or SiC anneal, as described in A. Pradeepkumar et. al., *Applied Physics Letters* 109, 196102 (2016), indicating the presence of a high compressive stress in the surface layers of the substrate.

A secondary cause of the electrical leakage may be a band gap change/reduction caused by intrinsic strain in the SiC film grown on silicon.

TABLE 1

Electrical characteristics measured at room temperature with Van der Pauw configuration for a p-Si substrate (before SiC film growth), 500 nm thin 3C—SiC/Si, and 5μ thick 3C—SiC/Si demonstrating current leakage and shorting even for thick SiC films.

|  | p-Si | 3C—SiC (500 nm) | 5μ 3C—SiC (5μ) |
|---|---|---|---|
| Carrier type | Holes | Holes | Holes |
| Sheet carrier concentration (cm⁻²) | $6(\pm 0.2) \times 10^{17}$ | $8(\pm 0.2) \times 10^{17}$ | $5(\pm 0.2) \times 10^{17}$ |
| Mobility (cm²/Vs) | 70(±10) | 50(±10) | 65(±10) |
| Sheet resistance (Ω/□) | 0.17(±0.02) | 0.17(±0.02) | 0.17(±0.02) |

Figure 5:
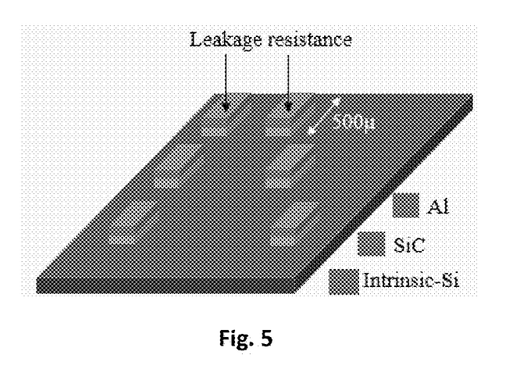
FIG. 5 is a schematic illustration of TLM structures formed on the SiC/intrinsic-Si substrate for leakage resistance measurements.

Turning now to the silicon carbide grown on intrinsic silicon, leakage resistance measurements across the SiC/intrinsic-Si were obtained using current-voltage measurements on TLM structures with 150 nm aluminium contacts, as shown in FIG. 5, and the results are summarised in Table 2 below. The current-voltage measurements were performed at room temperature to measure the SiC and silicon resistances (leakage) using a HP4145B semiconductor parameter analyser.

TABLE 2

Silicon resistances (leakage) measured at room temperature for SiC/intrinsic Si TLM structures. Results are the averaged values from four measurements.

| Contact Spacing (μm) | Leakage Resistance (kΩ) |
|---|---|
| 40 | 75 |
| 60 | 80 |
| 80 | 85 |
| 100 | 87 |
| 160 | 90 |
| 200 | 95 |
| 250 | 100 |
| 300 | 105 |

The measured resistances between the contacts are small compared to the expected values (in the MΩ range), which suggests that there is still conduction in 3C—SiC/intrinsic-Si in or around the SiC/Si interface region.

Cross-section transmission electron microscopy shows that the interface region between the silicon carbide and the intrinsic silicon wafer is highly non-planar, non-uniform, defective and intermixed (Si and C are easily miscible) on a nanometre scale. As the sheet resistance of the intrinsic silicon substrate is very high (~500 kΩ/□) and the numbers of sheet charge carriers are minimal ($10^{10}$ cm⁻²), the inventors conclude that the conductive region of SiC/intrinsic Si is confined to an interfacial layer created as a consequence of the SiC growth.

Figure 6:
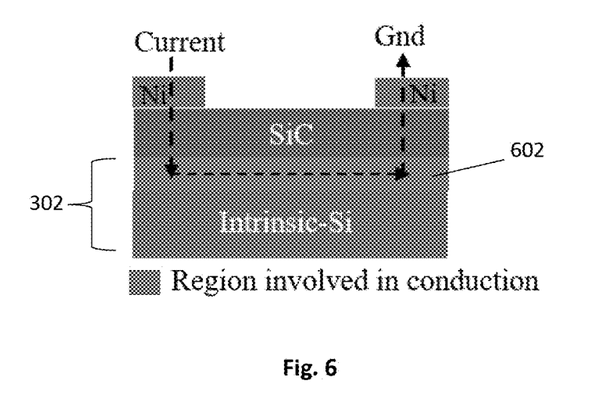
FIG. 6 is a schematic side view showing the electrical leakage flow through a defective intermixed layer between electrical contacts on a silicon carbide layer formed on an intrinsic silicon substrate.

In the case of intrinsic silicon, there is no electrical pn junction because the silicon is highly resistive with a slight predominance of n-type carriers. Accordingly, when a conductive p- or n-Si substrate is used, the electrical conduction happens through the entire silicon substrate, as shown schematically in FIG. 4, while in the intrinsic substrate 302, the leakage is limited to an interfacial region 602 of high electrical conductivity, as shown schematically in FIG. 6.

As described above, the inventors believe that the high electrical conductivity of the interfacial or surface (i.e., if the grown SiC has been removed) silicon layer is primarily due to the presence of electrically active interstitial carbon in the surface or interfacial silicon layer. During growth of the SiC layer (and any subsequent thermal processing), interstitial carbon can diffuse into the silicon substrate from the Si—SiC interface. The depth profile of interstitial carbon (and hence electrically active defect distribution) can be modelled as a function of thermal history (i.e., temperature as a function of time). For example, most simply, the SiC can be assumed to be a source of interstitial carbon, and the concentration of interstitial carbon as a function of depth into the silicon substrate can be approximated using its equilibrium diffusivity D given by (see A K Tipping and R C Newman, Semiconductor Science & Technology 2, 315 (1987)):

$$D = 0.44 \exp(-0.87/kT) \text{cm}^2\text{s}^{-1}$$

This hypothesis is also supported by Technology Computer-Aided Design (TCAD) simulations, as described in the inventors' publication A. Pradeepkumar et. al., *J. Appl. Phys.* 123, 215103 (2018), the entirety of which is hereby expressly incorporated by reference.

To demonstrate that the surface layer of the silicon is responsible for the electrical leakage, SiC/intrinsic-Si van der Pauw structures were then subjected to subsequent etching of silicon in between the SiC islands via ICP, using Ni as a hard mask. Van der Pauw measurements were repeated on the resulting structures. Additionally, the SiC/intrinsic-Si TLM structures were similarly etched by ICP. Current-voltage measurements were then repeated at room temperature.

Figure 12:
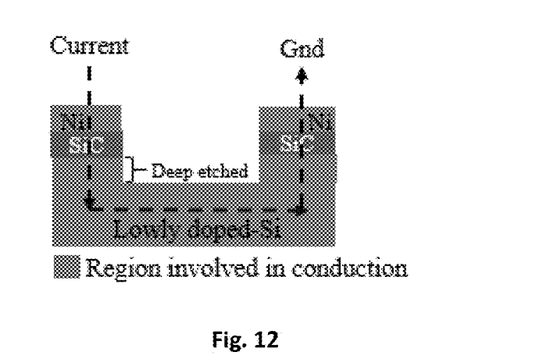
FIG. 12 is a schematic side view illustrating the conduction path in a deep etched silicon carbide on a conductive substrate.

For the commercial NOVASiC samples that were grown at a temperature of 1350° C. on a p-type silicon substrate, even after etching away completely the SiC (3C—SiC(100)/Si(100)) between the contacts, the contacts are still electrically shorted. This is expected behaviour, because the electrical conduction occurs through the entire conductive silicon substrate, as shown in FIG. 12.

Figure 8:
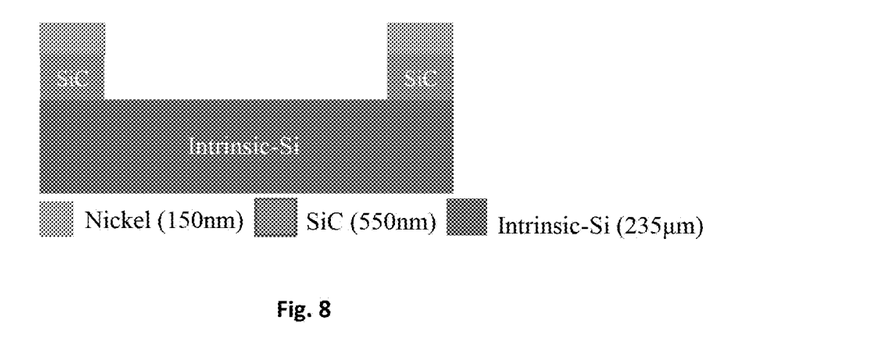
FIG. 8 is a schematic side view showing the electrical measurement structures used to measure electrical leakage between silicon carbide islands where only the silicon carbide layer has been removed between the islands.
Figure 9:
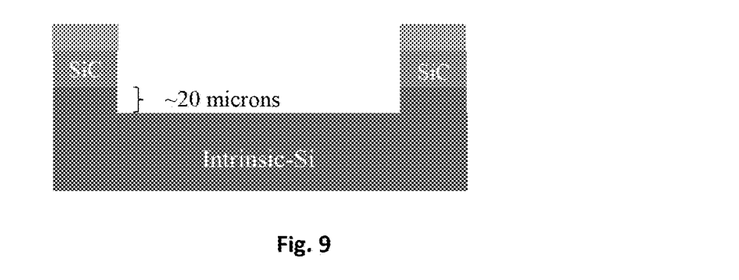
FIG. 9 is a schematic side view showing the electrical measurement structures used to measure electrical leakage between silicon carbide islands where both the silicon carbide layer and about 20 μm of the underlying silicon have been removed between the islands.

As shown in Table 3 below, in the case of the samples of silicon carbide grown on an intrinsic silicon substrate, measurements on samples taken from the original intrinsic silicon substrate have a high sheet resistance of about 500 kΩ/square, whereas the sheet resistance after growth of the 3C—SiC is only about 12 kΩ/square. Where the etching removed only the silicon carbide layer (leaving the conductive surface layer containing interstitial carbon), as shown in FIG. 8, the sheet resistance was unaffected, remaining at the same value of 12 kΩ/square, confirming that the silicon carbide layer is not responsible for the high conductivity. However, with continued etching to completely remove the conductive interfacial layer to a total removed thickness of about 20 μm, as shown in FIG. 9, the sheet resistance returns to the value of the original intrinsic silicon substrate, 492 kΩ/square, confirming that it is only the interface layer of silicon that is responsible for the high electrical conductivity.

Figure 7:
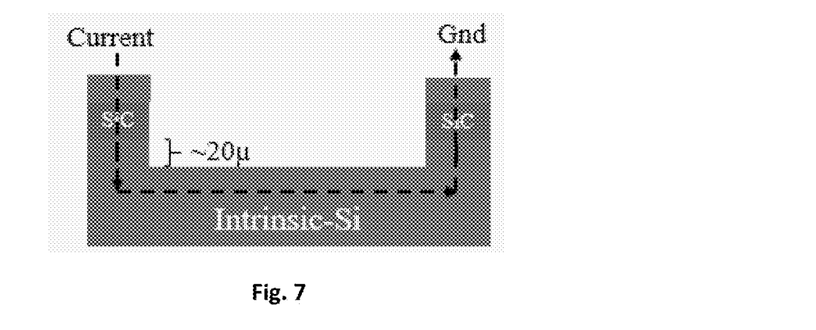
FIG. 7 is a schematic side view illustrating the electrical path through the intrinsic silicon substrate and between electrical contacts on the silicon carbide layer of FIG. 6 after removing a thickness of 20 μm (including the silicon carbide layer and the defective intermixed layer) from the region between the electrical contacts.

In other words, in the case of 3C—SiC on intrinsic Si formed as described above, the in-plane electrical leakage can be completely removed by removing the conductive surface region of the silicon, in this example to a depth of at least ~20 microns, as shown in FIG. 7.

TABLE 4

Silicon resistances (leakage) measured at room temperature for after 20μ deep etching between the contacts.

| Contact Spacing (μm) | Leakage Resistance (-Ω) |
| --- | --- |
| 40 | $8.5 \times 10^6$ |
| 60 | $8.5 \times 10^6$ |
| 80 | $9.5 \times 10^6$ |
| 4100 | $10 \times 10^6$ |
| 160 | — |
| 200 | $10 \times 10^6$ |
| 250 | — |
| 300 | — |

After etching away ~20μ of the silicon regions between the contacts, the leakage resistance increases to ~$10^6$Ω, which confirms that the contacts are electrically isolated, with no leakage current.

Figure 11:
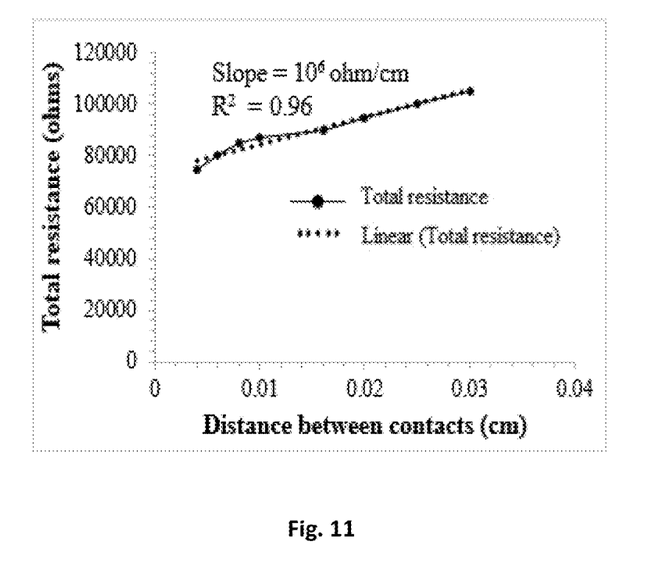
FIG. 11 is a graph of the measured electrical resistance between contacts of the TLM structures shown in FIG. 5 is a function of their spatial separation.

The sheet resistance of silicon before etching deep in the silicon substrate can be calculated from the graph of FIG. 11. Given the contact width of Z=500 um=0.05 cm, and the measured slope of the graph=$10^6$ Ω/cm, the sheet resistance for Si, Rsh=slope*width=$10^6$*0.05=50 k Ω/square, which is close to the SiC/Si sheet resistance of 12 kΩ in Table 3 observed after deposition of the SiC film, and still observed after the complete removal of the film, which is lower than expected for intrinsic silicon. This again confirms that a conductive/leaky interfacial layer is formed upon growth of the SiC, and that this conductive/leaky layer can be removed by deep etching the silicon.

In view of the role of interstitial carbon as described above, the inventors have identified that electrical leakage will also occur when other carbon-rich materials are grown or deposited on silicon at high temperatures. For example, when a layer of diamond or diamond-like carbon (DLC) is grown on silicon, interstitial carbon will diffuse into the underlying silicon to form an electrically conductive layer as has been demonstrated for SiC. Consequently, the subtractive process described above is equally applicable to remove the unwanted conductive layer of silicon to achieve electrical isolation between mutually spaced islands of diamond or DLC on silicon.

Returning to the flow diagram of the SiC isolation process, at step 102 a substrate including a layer of carbon-rich

TABLE 3

Room temperature Van der Pauw and Hall measurements on samples with an intrinsic silicon (i-Si) substrate: comparison of i-Si substrate only (as shown in FIG. 3), after growth of 3C—SiC on silicon (FIG. 2), after removal of SiC (FIG. 8), and after removal of the SiC and 20 μm of the underlying silicon (FIG. 9). Similar sheet resistance is only found after deep etching in the i-Si, indicating the formation of a conductive interfacial layer after SiC growth.

| | Intrinsic-Si | 3C—SiC/ intrinsic-Si | 3C—SiC/ intrinsic-Si (after removal of SiC) | 3C—SiC/ intrinsicSi (after 20μ deep etching) |
| --- | --- | --- | --- | --- |
| Carrier type | — | Electrons | Electrons | — |
| Sheet carrier concentration (cm$^{-2}$) | $1(\pm 0.2) \times 10^{10}$ | $3(\pm 0.2) \times 10^{11}$ | $4(\pm 0.2) \times 10^{11}$ | $5 \times 10^{11}$ |
| Mobility (cm$^2$/Vs) | 1220(±10) | 1677(±10) | 1650(±10) | 34 |
| Sheet resistance (Ω/□) | 500k ± 3k | 12k ± 3k | 12k ± 3k | 492k |

Figure 10:
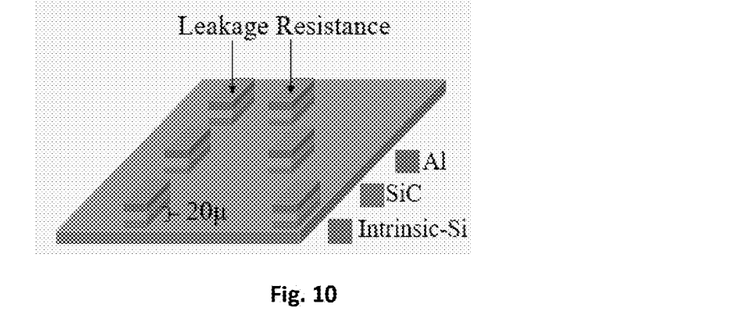
FIG. 10 is a schematic illustration of TLM structures formed on the SiC/intrinsic-Si substrate for leakage resistance measurements after removal of about 20 μm of the silicon in the region between the silicon carbide islands.

Similarly, the leakage resistance measurements described above were repeated on the SiC/intrinsic-Si TLM structures after ~20 μm silicon deep etching, as shown in FIG. 10, and the results are summarised in Table 4 below and plotted as a function of contact separation in FIG. 11.

material (which may be, for example, silicon carbide, diamond, or diamond-like carbon) on silicon is received or formed. As described above, this substrate includes an electrically conducting silicon interface layer on an electrically insulating material, and the electrically conducting silicon interface layer causes substantial electrical leakage to the carbon-rich material. Accordingly, at step 104 regions of the substrate are selectively removed to form mutually spaced islands of the carbon-rich material on the silicon, wherein the step of selectively removing regions of the substrate includes removing the carbon-rich material and at least a portion of the silicon (and thus at least a portion of the conductive layer containing interstitial carbon) from those regions to provide electrical isolation between the islands of carbon-rich material on silicon.

Figure 13:
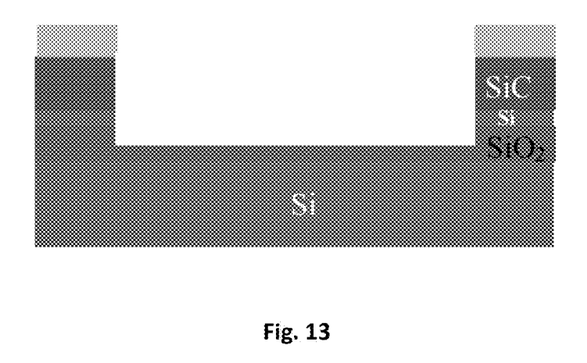
FIG. 13 is a schematic side view of a silicon carbide isolation structure formed from a silicon on insulator substrate having a buried oxide layer.
Figure 14:
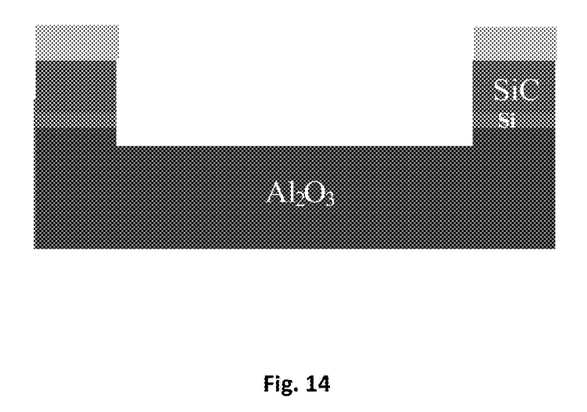
FIG. 14 is a schematic side view of a silicon carbide isolation structure formed from a silicon on sapphire substrate.

In the embodiments described above, the electrically insulating material is intrinsic silicon, a thin layer of which becomes electrically conductive during growth of the SiC and along the interface with the SiC. However, as noted above, in alternative embodiments the silicon carbide is grown on a silicon-on-insulator (SOI) substrate. In these embodiments, electrical isolation can be achieved by removing not only the silicon carbide layer, but also the entirety of the underlying silicon layer. If the silicon layer is undoped and thicker than the conductive portion of the layer, then it is only necessary to remove the conductive portion of the silicon layer, and a residual portion of the original silicon layer can optionally remain. Similarly, it may be acceptable to remove only a portion of the conductive portion of the silicon layer (i.e., leaving a residual portion of the conductive silicon layer that is thinner than the original conductive silicon layer) in applications where the requirements for electrical isolation are less stringent. However, it is most straightforward to remove the entirety of the silicon layer in the regions between the silicon carbide islands, leaving only the insulator therebetween, as shown in FIG. 13 for a buried oxide SOI substrate, and in FIG. 14 for a silicon-on-sapphire or 'SOS' substrate.

As described above, for some applications it may not necessary to remove the entire thickness of the conductive portion of the silicon layer, depending on the isolation requirements, for example. Additionally, although in the embodiment above where the SiC was grown at an extremely high temperature (≈1350° C.) the thickness of the conductive silicon layer is about ≈20 microns, this thickness depends upon the conditions under which the SiC layer is formed, and different conditions will produce conductive surface layers with other thicknesses. Consequently, the actual thickness that is removed in any given case depends upon a combination of the growth conditions of the SiC (and therefore the properties of the conductive or defective layer) and the degree of electrical isolation required. The 20 micron thickness value is a relatively extreme example where the conductive layer is relatively thick (believed due to the relatively large diffusion length of interstitial carbon at the high growth temperature over the duration of the growth step), and maximum electrical isolation is provided. In general, it is expected that in other embodiments the thickness removed will be at least about 1 micron, and in the range of about 1-20 microns. For example, in one embodiment, the thickness removed may be about 1 micron; in another embodiment about 2 microns, in another embodiment about 5 microns, in another embodiment about 10 microns, and in another embodiment about 15 microns. In any given case, the thickness can be determined or at least estimated as described above by calculating the expected diffusion length or depth profile of interstitial carbon during thermal processing, based on at least the diffusivity of interstitial carbon in silicon, according to:

$$D = 0.44 \exp(-0.87/kT) \mathrm{cm}^2 \mathrm{s}^{-1}$$

and/or (and more accurately) by making electrical measurements as a function of etch depth for different growth/processing conditions.

Many modifications will be apparent to those skilled in the art without departing from the scope of the present invention.

The invention claimed is:

1. An electrical isolation process, comprising:
receiving a substrate including a layer of carbon-rich material on silicon, the carbon-rich material having been grown directly onto a surface of one of: (i) an electrically insulating silicon layer of a silicon-on-insulator (SOI) wafer, and (ii) an electrically insulating silicon wafer; and
selectively removing regions of the substrate to form mutually spaced islands of the carbon-rich material on silicon;
wherein the growth of the carbon-rich material on the electrically insulating silicon produces a layer of electrically conductive silicon in contact with the carbon-rich material such that the layer of carbon-rich material on silicon comprises the layer of carbon-rich material on the electrically conductive layer of silicon on an electrically insulating material, and the step of selectively removing regions of the substrate comprises removing all of the carbon-rich material and at least a portion of the electrically conductive layer of silicon from those regions to provide electrical isolation between the islands of carbon-rich material on the electrically conductive layer of silicon.

2. The electrical isolation process of claim 1, including forming the substrate by growing the carbon-rich material directly onto the electrically insulating silicon substrate, wherein the step of growing comprises forming the electrically conductive layer of silicon between the layer of carbon-rich material and the electrically insulating silicon.

3. The electrical isolation process of claim 2, wherein the step of removing the carbon-rich material and at least a portion of the silicon comprises removing only a portion of the electrically conductive layer of silicon.

4. The electrical isolation process of claim 2, wherein the step of removing the carbon-rich material and at least a portion of the silicon comprises removing the electrically conductive layer of silicon.

5. The electrical isolation process of claim 1, wherein the carbon-rich material is 3C—SiC epitaxial with the underlying silicon, and the step of selectively removing regions of the substrate comprises removing at least about 20 microns of the silicon substrate.

6. The electrical isolation process of claim 1, wherein the substrate comprises the layer of carbon-rich material on a silicon-on-insulator (SOI) substrate.

7. The electrical isolation process of claim 6, wherein the electrically insulating material is sapphire or a layer of electrically insulating silicon on sapphire.

8. The electrical isolation process of claim 6, wherein the electrically insulating material is a silicon oxide material or a layer of electrically insulating silicon on a silicon oxide material.

9. The electrical isolation process of claim 6, comprising forming the substrate by growing the carbon-rich material on the silicon-on-insulator (SOI) substrate.

10. The electrical isolation process of claim 9, wherein the step of selectively removing regions of the substrate comprises removing all of a silicon layer of the SOI substrate from those regions.

11. The electrical isolation process of claim 1, comprising estimating a thickness of the removed silicon based on a corresponding diffusion length of interstitial carbon in silicon.

12. The electrical isolation process of claim 1, comprising estimating a thickness of the removed silicon based on electrical measurements of corresponding substrates etched to different depths.

13. The electrical isolation process of claim 1, wherein the carbon-rich material is diamond or diamond-like carbon.

14. The electrical isolation process of claim 1, wherein the carbon-rich material is silicon carbide.

15. An electrical isolation structure formed by the process of claim 1.

16. An electrical isolation structure, comprising:
a substrate composed of an electrically insulating substance; and
mutually spaced islands of a carbon-rich material on silicon (Si) on the electrically insulating substance, such that the mutually spaced islands of carbon-rich material on silicon are mutually electrically isolated;
wherein the carbon-rich material was grown directly onto a surface of one of: (i) an electrically insulating silicon layer of a silicon-on-insulator (SOI) wafer, and (ii) an electrically insulating silicon wafer, the growth of the carbon-rich material on the electrically insulating silicon producing a layer of electrically conductive silicon in contact with the carbon-rich material, such that the silicon of the carbon-rich material on silicon islands is or comprises the electrically conductive layer of silicon in contact with the carbon-rich material, such that, if the electrically conductive layer of silicon extended between the mutually spaced islands to interconnect the mutually spaced islands, the mutually spaced islands would not be mutually electrically isolated, or wherein at least a portion of the silicon has been removed from regions between the mutually spaced islands of carbon-rich material so as to provide electrical isolation therebetween.

17. The electrical isolation structure of claim 16, wherein the electrically insulating substance is a single silicon crystal substrate or a silicon-on-insulator (SOI) substrate.

18. The electrical isolation structure of claim 17, wherein the carbon-rich material on silicon islands extend to a thickness of at least 1 micron above the electrically insulating silicon located between the mutually spaced islands of carbon-rich material on silicon.

19. The electrical isolation structure of claim 17, wherein the carbon-rich material on silicon islands extend to a distance above the electrically insulating silicon located between the mutually spaced islands of carbon-rich material on silicon, wherein the distance is greater than or equal to a diffusion length of interstitial carbon in silicon during growth of the carbon-rich material on the Si.

20. The electrical isolation structure of claim 16, wherein the electrically insulating material is sapphire or a silicon oxide material.

21. The electrical isolation structure of claim 16, wherein the carbon-rich material is diamond or diamond-like carbon.

22. The electrical isolation structure of claim 16, wherein the carbon-rich material is silicon carbide.

23. The electrical isolation structure of claim 22, wherein the carbon-rich material is 3C—SiC, and the SiC on Si islands extend to a thickness of at least about 20 microns above the electrically insulating silicon located between the mutually spaced islands of silicon carbide on silicon.

* * * * *